United States Patent [19]

Spadavecchia et al.

[11] 4,057,789
[45] Nov. 8, 1977

[54] REFERENCE VOLTAGE SOURCE FOR MEMORY CELLS

[75] Inventors: Richard I. Spadavecchia, Hopewell Junction; James R. Struk, Wappingers Falls, both of N.Y.

[73] Assignee: International Business Machines Corporation, Armonk, N.Y.

[21] Appl. No.: 480,794

[22] Filed: June 19, 1974

[51] Int. Cl.² .................... G11C 7/06; G11C 11/40
[52] U.S. Cl. ............................. 365/189; 307/238; 365/154; 365/179
[58] Field of Search .................. 340/173 R; 307/238

[56] References Cited
U.S. PATENT DOCUMENTS

| | | | |
|---|---|---|---|
| 3,614,753 | 10/1971 | Walhstrom | 340/173 R |
| 3,745,539 | 7/1973 | Davidson et al. | 340/173 R |
| 3,909,631 | 9/1975 | Kitagawa | 307/238 |

*Primary Examiner*—Stuart N. Hecker
*Attorney, Agent, or Firm*—Wesley DeBruin

[57] ABSTRACT

An improved random access word addressable monolithic memory having a storage cell for each binary bit of each binary word of storage capacity. The storage cells being arranged in groups. Each cell of any given group being adapted to store a binary bit corresponding to a given bit position of each word stored in said memory. Each cell of each group being connected via first and second bit lines to a sense amplifier. Each sense amplifier coupled to a reference voltage source. The magnitude of the reference voltage supplied by the reference voltage source bearing a substantially invariant mathematical relationship to first and second potentials manifested by said storage cells during a read mode.

The storage cells may each be generally of the type disclosed and claimed in U.S. Pat. No. 3,423,737 entitled "Non Destructive Read Transistor Memory Cell" granted Jan. 21, 1969 to L. R. Harper and of common assignee with the instant application.

2 Claims, 6 Drawing Figures

$I_T = 30$ I CELL
$I_1 = 23$ I CELL
$I_2 = 7$ I CELL
$I_3 \approx \frac{7 \text{ I CELL}}{\beta + 1}$
$I_4 = 6$ I CELL
$I_5 = 5$ I CELL
$I_6 \approx 7$ I CELL

FIG. 3

REFERENCE VOLTAGE SOURCE FOR MEMORY CELLS

FIELD OF THE INVENTION

The invention relates generally to digital data processing systems and more particularly to a random access memory fabricated with transistor storage cells in integrated circuit form.

SUMMARY OF THE INVENTION

In accordance with the invention, a random access memory having a plurality of memory cells is provided. Each memory cell has a signal swing of $V_{s1}$ to $V_{s2}$ where the absolute magnitude of $|V_{s1}| - |V_{s2}|$ is in the order of 600 millivolts. When said memory is in the read mode, the state of selected cells in said memory are sensed by sense amplifier means. The sense amplifier means utilizes a bias reference voltage. The sense amplifier must distinguish between the first state of each said memory cell where $|V_{s1}| > |V_{s2}|$ and a second state of each said memory cell where $|V_{s2}| > |V_{s1}|$. The magnitude of the voltage swing of the cells of the memory chip will vary with the temperature, power supply, and component tolerances of the chip. The reliability and accuracy of the sense amplifier means is materially improved when the magnitude of the bias reference voltage varies directly with the variation in the voltage swing of the storage cell. Namely, as will be fully apparent from the detailed description hereinafter, improved read mode operation of the random access memory is accomplished when the magnitude of the reference voltage applied to the sense amplifier means accurately tracks the mid-point of the voltage swing of the memory cells.

In accordance with the invention, a reference voltage source is provided for use in a random access monolithic memory having a plurality of data storage cells; each of said cells comprising a first transistor and a second transistor; each of said cells being adapted to assume either a first stable state of conductivity or a second stable state of conductivity; sense amplifier means coupled to said plurality of data storage cells; selection means coupled to said plurality of cells for causing predetermined ones of said plurality cells to electrically manifest to said sense amplifier means whether said predetermined ones of said plurality of cells are respectively in said first stable state of conductivity or said second stable state of conductivity; said sense amplifier means being responsive to said electrical manifestations of said predetermined ones of said plurality of cells and said reference voltage source for providing a first electrical output for each of said predetermined ones of said plurality of cells which is in said first stable state and a second electrical output for each of said predetermined ones of said plurality of cells which is in said second stable state, said reference voltage source comprising: a third transistor having a collector, base and emitter; said collector of said third transistor being directly connected to a first potential; a first resistor connecting said base of said third transistor to said first potential; a fourth transistor having a collector, base and emitter; a second resistor connecting said collector of said fourth transistor to said emitter of said third transistor; said base of said fourth transistor being directly connected to said collector of said fourth transistor; said emitter of said fourth transistor being directly connected to a second potential source; a fifth transistor having a collector, base and emitter; a third resistor connecting said emitter of said fifth transistor to said second potential source; a fourth resistor connecting said emitter of said third transistor to said base of said fifth transistor; a Schottky Barrier Diode connected between said emitter of said third transistor and said collector of said fifth transistor; fifth and sixth resistors serially connected between said emitter of said third transistor and said collector of said fifth transistor; a sixth transistor having a collector, base and emitter; said collector of sixth transistor being connected to said first potential; said base of said sixth transistor being connected to the juncture of said fifth and sixth resistors; a seventh resistor connecting said emitter of said sixth transistor to said second potential; a seventh transistor having a collector, base and emitter; said emitter of said seventh transistor being directly connected to said emitter of said sixth transistor; an eighth resistor connecting said collector of said seventh transistor to said first potential; an eighth transistor having a collector, base and emitter; said collector of said eighth transistor being connected to said first potential source; said base of said eighth transistor being connected to said collector of said seventh transistor; a ninth resistor connecting said emitter of said eighth transistor to said second potential; a reference voltage source output terminal directly connected to said base of said seventh transistor and said emitter of said eighth transistor; and means connecting said reference voltage source output terminal to said sense amplifier means, whereby the potential of said reference voltage source manifested at said reference voltage source output terminal tracks the magnitude of the electrical manifestations from said predetermined ones of said plurality of cells.

It is a primary object of the invention to provide an improved random access monolithic memory.

It is a further primary object of the invention to provide a random access monolithic memory wherein the data stored in said memory is precisely and accurately read at a rapid rate.

It is a further primary object of the invention to provide a random access monolithic memory chip that is less sensitive in operation to temperature, power supply and component variations.

It is a further object of the invention to provide a circuit for use in a random access monolithic memory, where said circuit simulates the exact loading of a plurality of cells as seen by the work driver and where said circuit in cooperation with sensing means accurately and precisely electrically manifests the data content of any one of a plurality of words respectively stored in the memory.

It is a further object of the invention to provide an improved bias circuit for use in a 256 word, nine binary bit per word, Read/Write memory array fabricated on a monolithic chip of semiconductor material by Large Scale Integration techniques.

It is a further object of this invention to provide a bias circuit for providing a reference potential to a plurality of sense amplifiers employed to read the conductive state of a plurlity of bistable memory cells where said bias circuit, said sense amplifiers, and said bistable memory cells are all contained in closed proximity one to another on a monolithic semiconductor structure, where said bias circuit provides a reference voltage which is a function of electrical currents within said bias circuit and said currents within said bias circuit bear a substantially invariant mathematical relationship to electrical currents in said plurality of bistable memory cells, whereby the magnitude of said reference potential bears a substantially invariant mathematical relationship to potentials existing in said memory cells.

It is a further object of this invention to provide a bias circuit for use in a monolithic Read/Write memory array where said bias circuit simulates the exact loading of a number of cells as seen by the work driver.

It is an object of this invention to provide a bias voltage source for use in a memory having a plurality of bistable storage cells where each cell has a voltage swing of $V_1$ to $V_3$ where $V_1$ is greater in magnitude than $V_3$, the magnitude of the bias voltage is $(V_1 + V_3)/2$ and the magnitude of the bias voltage tracks changes in the voltage swing due to temperature, power supply and component variations.

It is an object of this invention to provide a bias voltage whose magnitude moves at the same rate with temperature as the midway voltage of associated bistable memory cells.

It is an object of this invention to provide in a monolithic Read/Write array, a bias voltage circuit where the sigma of the voltage differential between memory cell voltage levels and the magnitude of the bias voltage is reduced.

It is an object of the invention to provide a monolithic Read/Write array wherein the voltage difference between word line voltage and the memory cell UP level voltage due to base loading is simulated in a bias circuit by adjusting the current of a differential amplifier.

The foregoing and other objects, features and advantages of the invention will be apparent from the following more particular description of preferred embodiments of the invention, as illustrated in the accompanying drawings.

FIG. 2 also depicts the memory cells and sense amplifiers of a storage position, or address, of the memory of FIG. 1.

Figures 1, 1A:
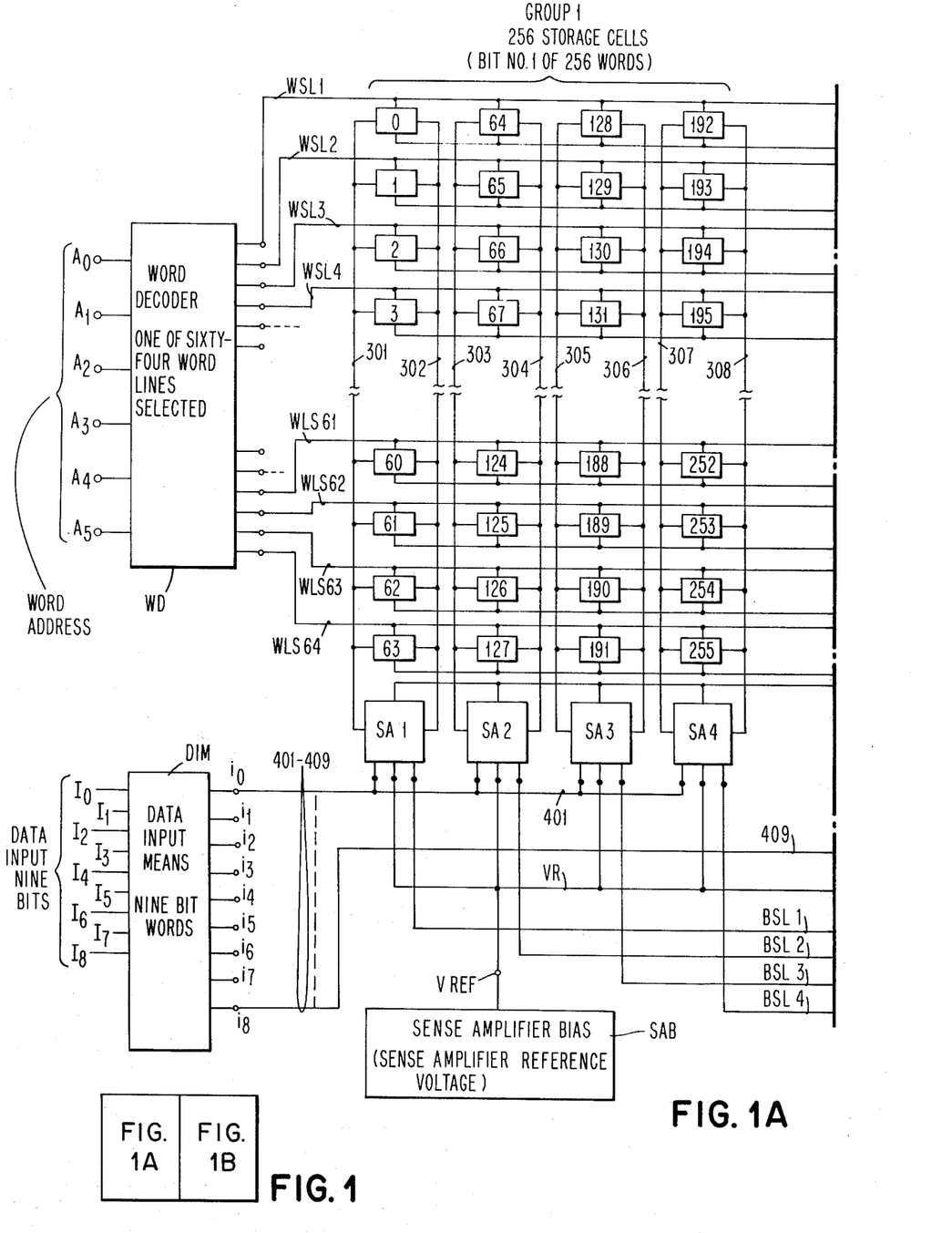
FIG. 1A and 1B placed together as shown in FIG. 1 disclose a schematic block diagram of a monolithic memory for practicing the invention.
Figure 1B:
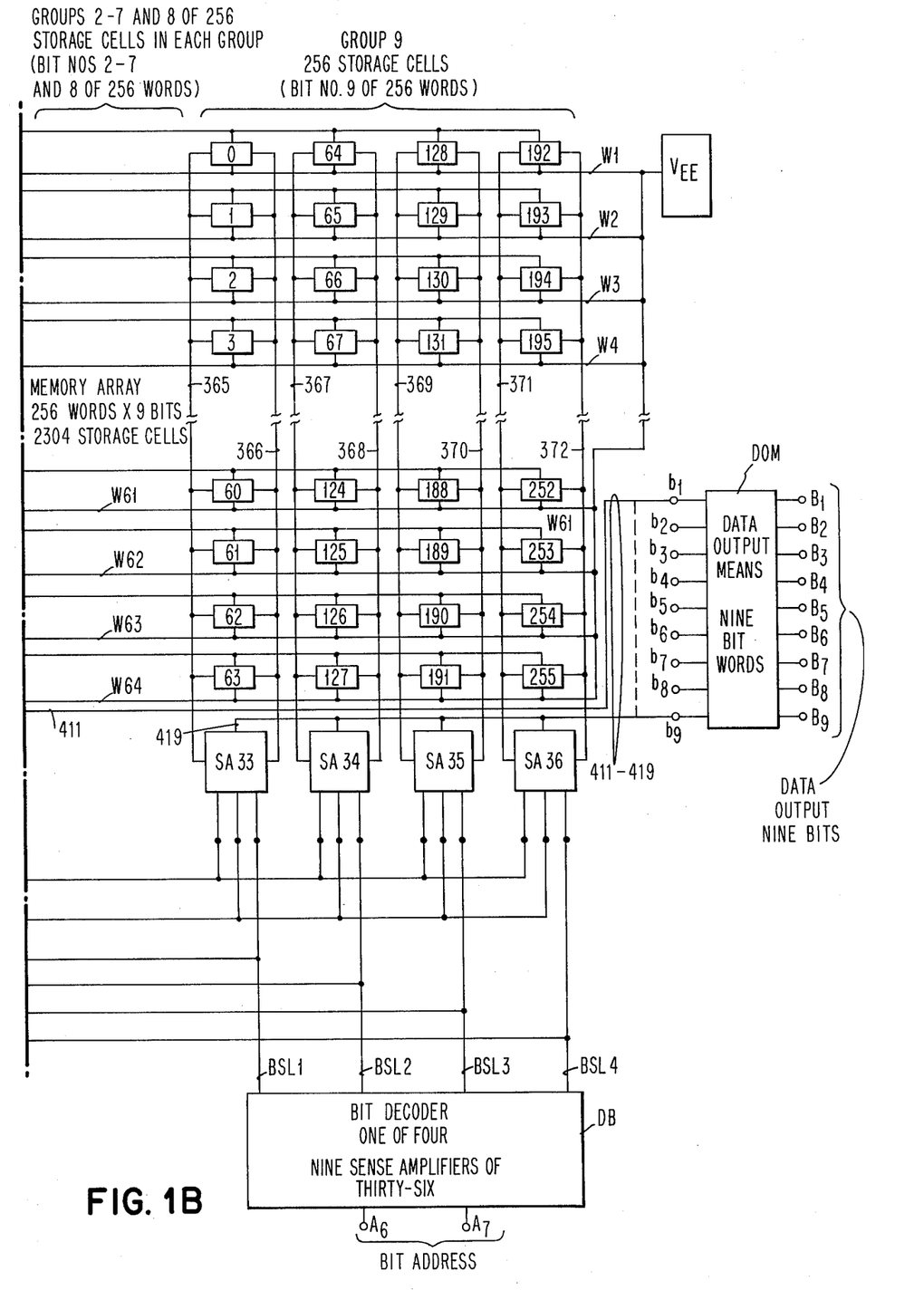

Referring to FIG. 1, a block diagram representative of a random access monolithic memory that may be employed to practic applicants' invention is disclosed.

Referring to the legend Group 1, there are 256 storage cells arranged in four columns. As seen from FIG. 1, a sense amplifier is associated with each column. Storage cells 0 through 63, column 1 of Group 1, are respectively coupled by bit lines 301 and 302 to Sense Amplifier S.A. 1. Storage cells 64 through 127, column 2 of Group 1, are respectively, coupled by bit lines 303 and 304 to Sense Amplifier S.A. 2. Storage cells 128 through 191, column 3 of Group 1, are respectively coupled through bit lines 305 and 306 to Sense Amplifier S.A. 3. Storage cells 192 through 255, column 4 of Group 1, are respectively coupled through bit lines 307 and 308 to Sense Amplifier S.A. 4.

The monolithic memory depicted in FIG. 1 has nine groups of memory cells and associated Sense Amplifiers. Only Groups 1 and 9 are depicted in relative detail. Each of the Groups 2 through 9 is identical to Group 1.

The monolithic memory as depicted in FIG. 1 has the capacity to store 256 binary words each word having nine binary bits. Correspondingly, the monolithic memory of FIG. 1 may be utilized to store 256 bytes of binary data where a byte is nine binary bits of a binary word. The nine binary bits of each of the 256 words stored in the memory of FIG. 1 may be eight binary bits of data and a parity bit associated therewith.

For convenience of illustration, consider the memory of FIG. 1 to have 256 addresses, each storage address having the capacity to store nine binary bits. Further, for convenience of illustration, consider the 256 addresses to be designated by 0, 1, 2, - - - 252, 253, 254 and 255. Now recalling that each Group 1 through 9 has 256 storage cells designated as 0, 1, 2, 3, 4, - - - 252, 253, 254 and 255, as depicted in FIG. 1, it will be appreciated that, the cells of Group 1 store a first binary bit of each of said 256 words; the cells of Group 2 store a second binary bit of each of said 256 words; - - - ; the cells of Group 8 store an eighth binary bit of each of said 256 words; and the cells of Group 9 store a ninth binary bit of each of said 256 words.

For purposes of brevity and convenience of illustration, Sense Amplifiers 5 through 32 and the memory cells of Groups 2 through 8 are not expressly shown in FIG. 1. Namely: Sense Amplifiers 1, 5, - - - 29 and 33 are respectively coupled to cells 0 through 63 of Groups 1 through 9; Sense Amplifiers 2, 6 - - - , 30 and 34 are respectively coupled to cells 64 through 127 of Groups 1 through 9, etc. The foregoing relationship between Sense Amplifiers, memory cells, and groups is conveniently and fully tabulated for the memory of FIG. 1 in the following table, TABLE NO. 1.

TABLE NO. 1

| Sense Amplifier | Group No. | Storage Cells | | |
|---|---|---|---|---|
| S.A. 1 | 1 | 0 | through | 63 |
| S.A. 2 | " | 64 | " | 127 |
| S.A. 3 | " | 128 | " | 191 |
| S.A. 4 | " | 192 | " | 255 |
| S.A. 5 | 2 | 0 | " | 63 |
| S.A. 6 | " | 64 | " | 127 |
| S.A. 7 | " | 128 | " | 191 |
| S.A. 8 | " | 192 | " | 255 |
| S.A. 9 | 3 | 0 | " | 63 |
| S.A. 10 | " | 64 | " | 127 |
| S.A. 11 | " | 128 | " | 191 |
| S.A. 12 | " | 192 | " | 255 |
| S.A. 13 | 4 | 0 | " | 63 |
| S.A. 14 | " | 64 | " | 127 |
| S.A. 15 | " | 128 | " | 191 |
| S.A. 16 | " | 192 | " | 255 |
| S.A. 17 | 5 | 0 | | 63 |
| S.A. 18 | " | 64 | | 127 |
| S.A. 19 | " | 128 | | 191 |
| S.A. 20 | " | 192 | | 255 |
| S.A. 21 | 6 | 0 | | 63 |
| S.A. 22 | " | 64 | | 127 |
| S.A. 23 | " | 128 | | 191 |
| S.A. 24 | " | 192 | | 255 |
| S.A. 25 | 7 | 0 | | 63 |
| S.A. 26 | " | 64 | | 127 |
| S.A. 27 | 7 | 128 | through | 191 |
| S.A. 28 | " | 192 | " | 255 |
| S.A. 29 | 8 | 0 | " | 63 |
| S.A. 30 | " | 64 | " | 127 |
| S.A. 31 | " | 128 | " | 191 |
| S.A. 32 | " | 192 | " | 255 |
| S.A. 33 | 9 | 0 | " | 63 |
| S.A. 34 | " | 64 | " | 127 |
| S.A. 35 | " | 128 | " | 191 |
| S.A. 36 | " | 192 | " | 255 |

Referring to FIG. 1, the BIT DECODER BD, in response to a two binary bit address on terminals $A_6$ and $A_7$, conditions or selects one, and only one, of the four bit select lines respectively designated BSL 1, BSL 2, BSL 3 and BSL 4. Bit Select Line BSL 1 is coupled to, and when selected conditions each of the Sense Amplifiers of unit one; namely, Sense Amplifiers S.A. 1, S.A. 5, S.A. 9 - - - S.A. 25, S.A. 29 and S.A. 33. Bit Select Line BSL 2 is coupled to, and when selected conditions each of the Sense Amplifiers of unit two, namely, Sense Amplifiers S.A. 2, S.A. 6, S.A. 10 - - - S.A. 26, S.A. 30 and S.A. 34. Bit Select Line BSL 3 is coupled to and when selected conditions each of the Sense Amplifiers of unit three; namely, Sense Amplifiers S.A. 3, S.A. 7, S.A. 11 - - - S.A. 27, S.A. 31 and S.A. 35. Bit Select Line BSL 4 is coupled to and when selected conditions each of the Sense Amplifiers of unit four; namely Sense Amplifiers S.A. 4, S.A. 8, S.A. 12 - - - S.A. 28, S.A. 32 and S.A. 36.

Referring to FIG. 1, the Word Decoder WD, in response to a six binary bit word address on terminals $A_0$, $A_1$, $A_2$, $A_3$, $A_4$ and $A_5$ conditions, or selects one, and only on of the 64 word select lines respectively designated WSL 1 through WSL 64. From FIG. 1, it is further seen that each of the 64 WORD SELECT LINES is coupled to a distinct subgroup of four memory cells of each of the Groups 1 through 9. Namely, WSL 1 is coupled to memory cells having storage addresses 1, 64, 128 and 192; WSL 2 is coupled to memory cells having storage addresses 1, 65, 129 and 193; WSL 3 is coupled to memory cells 2, 66, 130 and 194; and in like manner for work lines WSL 4 through WSL 64, respectively.

A particular storage address is addressed by selecting the appropriate WORD SELECT LINE and BIT SELECT LINES. For example, storage address 189, is addressed by selecting WORD SELECT LINES WSL 62 and BIT SELECT LINE BSL 3. Word Select Line WSL 62 is coupled to memory cells having storage addresses 61, 125, 189 and 252. BIT SELECT LINE BSL 3 is coupled to memory cells having storage addresses 128 through 191.

Table No. 2 is a tabulation reciting the particular word line (one of 64) and the particular BIT line (one of four) which must be conditioned or selected, for addressing each of the 256 storage addresses.

TABLE NO. 2

| Word Select Line Selected (WSL) | Bit Select Line Selected (BSL) | | | |
|---|---|---|---|---|
| | 1 | 2 | 3 | 4 |
| 1 | 0 storage address | 64 storage address | 128 storage address | 192 storage address |
| 2 | 1 | 65 | 129 | 193 |
| 3 | 2 | 66 | 130 | 194 |
| 4 | 3 | 67 | 131 | 195 |
| 5 | 4 | 68 | 132 | 196 |
| 6 | 5 | 69 | 133 | 197 |
| 7 | 6 | 70 | 134 | 198 |
| 8 | 7 | 71 | 135 | 199 |
| 9 | 8 | 72 | 136 | 200 |
| 10 | 9 | 73 | 137 | 201 |
| 11 | 10 | 74 | 138 | 202 |
| 12 | 11 | 75 | 139 | 203 |
| 13 | 12 | 76 | 140 | 204 |
| 14 | 13 | 77 | 141 | 205 |
| 15 | 14 | 78 | 142 | 206 |
| 16 | 15 | 79 | 143 | 207 |
| 17 | 16 | 80 | 144 | 208 |
| 18 | 17 | 81 | 145 | 209 |
| 19 | 18 | 82 | 146 | 210 |
| 20 | 19 | 83 | 147 | 211 |
| 21 | 20 | 84 | 148 | 212 |
| 22 | 21 | 85 | 149 | 213 |
| 23 | 22 | 86 | 150 | 214 |
| 24 | 23 | 87 | 151 | 215 |
| , | , | , | , | , |
| , | , | , | , | , |
| 56 | 55 | 119 | 183 | 247 |
| 57 | 56 | 120 | 184 | 248 |
| 58 | 57 | 121 | 185 | 249 |
| 59 | 58 | 122 | 186 | 250 |
| 60 | 59 | 123 | 187 | 251 |
| 61 | 60 | 124 | 188 | 252 |
| 62 | 61 | 125 | 189 | 253 |
| 63 | 62 | 126 | 190 | 254 |
| 64 | 63 | 127 | 191 | 255 |

From the foregoing explanation, Table Nos. 1 and 2 and FIG. 1, it is apparent that each of the 256 storage locations is addressable. Each storage location comprises nine discrete storage cells. When a particular storage location is addressed, nine discrete storage cells and nine discrete Sense Amplifiers respectively coupled thereto are selected. For example, when storage address 195 is addressed by WORD SELECT LINE WSL 4 and BIT SELECT LINE BSL 4, memory cells 195 of Groups 1 through 9 respectively, and Sense Amplifiers S.A. 4, S.A. 8, S.A. 12, S.A. 16, S.A. 20, S.A. 24, S.A. 28, S. A. 32 and S.A. 36 are selected.

Still referring to FIG. 1, the Data Input Means bearing reference character DIM is employed when the memory is in the "write mode". The circuitry and mode of operations of the Data Input means, for purposes of explanations, may be considered to be a register having the capacity to store nine binary bits of data. The register being adapted to accept nine binary bits of data on input terminals $I_0$, $I_1$, $I_2$, - - - $I_6$, $I_7$, $I_8$, and under control of a clock or control signal, not shown, electrically manifest the content of said register on outputs $i_0$, $i_1$, $i_2$, - - - $i_5$, $i_6$, $i_7$ and $i_8$. As represented, by leads 401 through 409 in FIG. 1, and Table No. 3 below, outputs $i_0$ through $i_8$ are selectively coupled to the 36 Sense Amplifiers S.A. 1 through S.A. 36.

TABLE NO. 3

| Output of Data Input Means (DIM) | Sense Amplifiers | Connection Represented by Leads | Bit Position of Binary Word(s) in Memory |
|---|---|---|---|
| $i_0$ | S.A. 1 | 401 | one |
| | S.A. 2 | | |
| | S.A. 3 | | |
| | S.A. 4 | | |
| | S.A. 5 | | |
| $i_1$ | S.A. 6 | 402* | two |
| | S.A. 7 | | |
| | S.A. 8 | | |
| | S.A. 9 | | |
| $i_2$ | S.A. 10 | 403* | three |
| | S.A. 11 | | |
| | S.A. 12 | | |
| | S.A. 13 | | |
| $i_3$ | S.A. 14 | 404* | four |
| | S.A. 15 | | |
| | S.A. 16 | | |
| | S.A. 17 | | |
| $i_4$ | S.A. 18 | 405* | five |
| | S.A. 19 | | |
| | S.A. 20 | | |
| | S.A. 21 | | |
| $i_5$ | S.A. 22 | 406* | six |
| | S.A. 23 | | |
| | S.A. 24 | | |
| | S.A. 25 | | |
| $i_6$ | S.A. 26 | 407* | seven |
| | S.A. 27 | | |
| | S.A. 28 | | |
| | S.A. 29 | | |
| $i_7$ | S.A. 30 | 408* | eight |
| | S.A. 31 | | |
| | S.A. 32 | | |
| | S.A. 33 | | |
| $i_8$ | S.A. 34 | 409 | nine |
| | S.A. 35 | | |
| | S.A. 36 | | |

*not expressly shown in Figure 1.

As is now apparent, and will be more fully apparent from the detailed description hereinafter, nine bit binary words successively manifested at terminals $i_0$, $i_1$ - - - $i_7$ and $i_8$ may be placed in storage at any predetermined ones of said 256 storage addresses. Briefly, when the memory as represented in FIG. 1, is in the "write mode", a particular storage address is selected by the activated Word Select Line and the activated Bit Select Line. The binary word (or byte) manifested on terminals $i_0, i_1 - - - i_7$ and $i_8$ is conveyed via the selected Sense Amplifiers to the selected storage address.

Still referring to FIG. 1, the Data Output Means, DOM, is employed when the memory is in the "read mode". The circuitry and mode of operation of the Data Output Means may be considered to be a register having the capacity to store nine binary bits of data. The register being adapted to accept nine binary bits of data on input terminals $b_1, b_2, b_3 - - - b_7, b_8$ and $b_9$ and under control of a clock, or control signal, not shown, electrically manifest the content of said register on outputs $B_1, B_2, B_3 - - - B_7, B_8$ and $B_9$. As represented by leads 411 through 419 in FIG. 1 and Table No. 4, inputs $b_1$ through $b_9$ of the DOM are selectively coupled to the 36 Sense Amplifiers S.A. 1 through S.A. 36.

TABLE NO. 4

| Output of Data Output Means (DOM) | Sense Amplifiers | Connection Represented by Leads | Bit Position of Binary Word(s) in Memory |
|---|---|---|---|
| $b_1$ | S.A. 1<br>S.A. 2<br>S.A. 3<br>S.A. 4<br>S.A. 5 | 411 | one |
| $b_2$ | S.A. 6<br>S.A. 7<br>S.A. 8<br>S.A. 9 | 412* | two |
| $b_3$ | S.A. 10<br>S.A. 11<br>S.A. 12<br>S.A. 13 | 413* | three |
| $b_4$ | S.A. 14<br>S.A. 15<br>S.A. 16<br>S.A. 17 | 414* | four |
| $b_5$ | S.A. 18<br>S.A. 19<br>S.A. 20<br>S.A. 21 | 415* | five |
| $b_6$ | S.A. 22<br>S.A. 23<br>S.A. 24<br>S.A. 25 | 416* | six |
| $b_7$ | S.A. 26<br>S.A. 27<br>S.A. 28<br>S.A. 29 | 417* | seven |
| $b_8$ | S.A. 30<br>S.A. 31<br>S.A. 32<br>S.A. 33 | 418* | eight |
| $b_9$ | S.A. 34<br>S.A. 35<br>S.A. 36 | 419 | nine |

*not expressly shown in Figure 1.

As is now apparent and will be more fully apparent from the detailed description hereinafter, nine bit binary words may be successively read from any predetermined storage positions and manifested at terminals $B_1, B_2 - - - B_8$ and $B_9$. Briefly, when the memory is in the "read mode", the data stored in a particular storage address, as determined by the selected word line and the selected bit line, is read from storage. This data (nine binary bits) is conveyed via the Sense Amplifiers associated with the read address to the inputs $b_1$ through $b_9$ of the Data Output Means. Under control of the Data Output Means this data is manifested at terminals $B_1$ through $B_9$.

Referring to FIG. 1, it will be seen that each of the 256 memory cells, (or bistable devices) of each group is coupled to a Word Select Line, a bias line and first and second bit lines. For example, memory cells 0, 64, 128 and 192 of each of the nine groups depicted in FIG. 1 are connected between Word Select Line WSL 1 and bias line W1. There is an electrical potential difference maintained between WSL 1 and WL to provide electrical energy to the memory cells connected thereto.

Stated differently, each of the 2304 memory cells of the memory as represented in FIG. 1 is connected between a Word Select Line and a bias line. There are 64 discrete pairs of word and bias lines. The pairs of word bias lines are respectively, WSL1 and W1, WSL2 and W2, WSL3 and W3 - - - WSL62 and W62, WSL63 and W63 and WSL64 and W64. Each pair of word and bias lines is connected to 36 memory cells (four in each of said nine groups). Each of said 2304 memory cells of the memory as represented in FIG. 1 is connected via a pair of bit lines to a Sense Amplifier. There are four Sense Amplifiers per group of memory cells. Each Sense Amplifier of each group is connected to 64 memory cells within the group with which the Sense Amplifier is associated.

Now consider the memory of FIG. 1 to be neither in the "write mode" nor the "read mode". Further, assume that 256 binary words each having 9 binary bits are stored in the memory. Each of the 2304 binary memory cells is in either a first conductive state or a second conductive state. The particular conductive state (first or second) of each cell is dictated by whether said cell is storing a binary "1", or a binary "0". Each of the 2304 memory cells will have impressed upon it a potential by its associated word and bias lines. The potential impressed across each of the 2304 cells in the absence of a "read" or "write" operation is substantially constant and equal in magnitude. Under these conditions, namely the memory is not in a "read mode" or "write mode", there is no current (or no significant current) flowing in any of the sense lines 301 through 372.

READ MODE OF MEMORY OF FIG. 1

Assume that during the "read mode" the binary word stored at storage address 3 is to read. A predetermined particular storage address impressed on terminals $A_0, A_1 - - - A_4$ and $A_5$ of the Word Decoder WD results in Word Select Line WSL4 being selected. When Word Select Line WSL4 is selected or conditioned the magnitude of the potential respectively across memory cells 3, 67, 131 and 195 of each of the Groups 1 through 9 is modified, namely increased.

Selecting Word Line WSL4 permits the BIT DECODER to address, or in this example, select for "reading", the data stored at any one of the afore-recited storage addresses, namely 3, 67, 131 and 195. To select storage address 3, a predetermined particular bit address is impressed on Bit Address Terminals $A_6$ and $A_7$ of the Bit Decoder BD to select or condition Bit Select Line BSL1. Thus, with Word Select Line WSL4 and Bit Select Line BSL1 conditioned, storage address 3 is addressed. It is to be noted that the memory of FIG. 1 employs a storage address comprised of a binary word having bit positions $A_0, A_1 - - - A_6$ and $A_7$.

Further, during a read operation, the Data Input Means is not activated whereas the Data Output Means is activated. The activation and deactivation of the Data Input Means and the Data Output Means, respectively, is accomplished by control circuitry not shown. However, from the detailed description hereinafter, the implementation thereof will be fully apparent to those skilled in the art.

When the memory of FIG. 1 is in the "read mode" and storage address 3 is addressed, memory cell 3 in each of the nine groups of cells is activated (magnitude of potential across it increased) and Sense Amplifiers 1, 5, 9, 13, 17, 21, 25, 29 and 33 are respectively conditioned.

Sense Amplifier 1 senses and electrically manifests the electrical state (first or second) of memory cell 3 of group 1. Sense Amplifier 5 senses and electrically manifests the electrical state (first or second) of memory cell 3 of group 2. Sense Amplifiers 9, 13, 17, 21, 25, 29 and 33 respectively sense and electrically manifest the electrical state of the memory cells 3 of groups 3 through 9 respectively. Thus, during a reading operation, the binary word stored at address 3 is electrically manifested via the bit lines 301 and 302, 309 and 310, 317 and 318, - - - 365, and 366, Sense Amplifiers 1, 5, 9 - - - 29 and 33, leads 411 through 419 and the Data Output Means DOM on terminals $B_1$, $B_2$ - - - $B_8$ and $B_9$.

The "read mode" of the memory of FIG. 1 will be described in greater detail hereinafter. For simplicity of explanation, consider only cell 3 of group 1 which is connected via Bit Lines 301 and 302 to Sense Amplifier 1. When address 3 is addressed for reading, cell 3 of group 1 will manifest its electrical state on bit lines 301 and 302.

The electrical state of bit lines 301 and 302 is sensed by Sense Amplifier S.A.1. For purposes of illustration, assume cell 3 of group 1 is in its first state of conductivity. Then bit line 302 will have flowing therein a sizeable current as compared to the zero magnitude, or negligible current flow in bit line 301. Sense Amplifier S.A. 1 senses this disparity in current flow in bit lines 301 and 302 and provides a first electrical manifestation on lead 411. Now assume cell 3 of group 1 is in its second state of conductivity. Then bit line 301 will have flowing therein a sizeable current as compared to zero magnitude, or negligible current flow in bit line 302. Sense Amplifier S.A.1 senses this disparity in current flow in bit lines 301 and 302 provides a second electrical manifestation on lead 411. It will be appreciated that said first and second electrical manifestations of Sense Amplifier S.A. 1 are discrete distinct electrical manifestations respectively indicative of, or manifesting, the electrical state (binary "1" or "0") of cell 3 of group 1.

WRITE MODE OF MEMORY OF FIG. 1

Assume a nine bit binary word is to be written into, or placed in storage at storage address 129. A predetermined particular word address impressed on terminals $A_0$, $A_1$ - - - $A_4$, $A_5$ of the Word Decoder WD results in Word Select Line WSL2 being selected. When Word Select Line WSL2 is selected or conditioned, the magnitude of the potential respectively across memory cells, 1, 65, 129 and 193 of each of the groups 1 through 9 is modified, namely increased.

Selecting Word Line WSL2 permits the Bit Decoder to address, or in this example, select for "writing", one of the afore-recited storage addresses, namely, 1, 65, 129 and 193. To select storage address 129 a predetermined particular bit address is impressed on Bit Address Terminals $A_6$ and $A_7$ of the Bit Decoder BD to select or condition Bit Select Line BSL3. Thus, with Word Select Line WSL2 and Bit Select Line BSL3 conditioned, storage address 129 is addressed.

Further, during a "write" operation, the Data Input Means is activated whereas the Data Output Means is not activated. The activation and deactivation of the Data Output Means and Data Input Means, respectively, is accomplished by control circuitry not shown. However, from the detailed description hereinafter the implementation thereof will be fully apparent to and well within the skill of the art.

When the memory of FIG. 1 is in the "write mode", and storage address 129 is addressed, memory cell 129 in each of the nine groups of cells is conditioned (the magnitude of potential across it is increased) and Sense Amplifiers 3, 7, 11, 15, 19, 23 27, 31 and 35 are respectively conditioned. With the Data Input Means activated, the nine bit binary word manifested on terminals $i_0$, $i_1$, - - - $i_7$ and $i_8$ will be impressed via leads 401 through 409 on selected Sense Amplifiers S.A.3, S.A.7, S.A.11 - - - S.A.31 and S.A.33. Via the afore-recited Sense Amplifiers and the pairs of bit lines connecting said Sense Amplifiers to memory cells 129 of storage address 129, the nine bit binary word manifested at terminals $i_0$, $i_1$, - - - $i_8$ and $i_9$ will be placed in storage at storage address 129.

The "read mode" of the memory of FIG. 1 wll be described in greater detail hereinafter. For simplicity of explanation, consider only cell 129 of group 1. When address 129 is addressed for writing, cell 129 of group 1 will have its electrical state dictated by Sense Amplifier S.A.3 via bit lines 305 and 306. Stated alternatively, Sense Amplifier S.A.3 in response to a binary value of "0" or "1" manifested on terminal $i_0$ of the Data Input Means will cause cell 129 of Group 1 to remain in the electrical state consistent therewith, or to change to the state consistent therewith. For example, assume the data manifested at terminal $i_0$ and to be written into storage at cell 129 of Group 1 calls for cell 129 of Group 1 to be in its first state. If cell 129 is already in said first state Sense Amplifier S.A.3 will cause cell 129 of Group 1 to remain in said first state. If cell 129 of Group 1 is in said second state, Sense Amplifier S.A.3 will cause cell 129 of Group 1 to assume said first state. Sense Amplifier S.A.3 dictates the state of cell 129 of Group 1, when information is to be written into said cell, by biasing bit lines 305 and 306. This forces said cell to maintain, or assume, the electrical state consistent with the bias on said bit lines.

Still referring to FIG. 1, it will be seen that each of the 36 Sense Amplifiers S.A.1, S.A.2, - - - S.A.35 and S.A.36 is connected to a Sense Amplifier Bias source represented in FIG. 1 by the block labelled S.A.B. The output of the Sense Amplifier Bias source is a reference voltage $V_{ref}$ which is utilized and required by each of the Sense Amplifiers. The reference voltage $V_{ref}$ is impressed on each of the 36 Sense Amplifiers by the lead designated as VR.

When a memory array such as generally depicted in FIG. 1 is fabricated by Large Scale Integration techniques on a monolithic chip of semiconductor material serious attention must be directed to many factors to provide an efficient reliable and relatively economical random access memory. Included in these factors are relative complexity, size, signal levels, switching speed of a cell, read time, write time, power requirements, etc. The above is not submitted as an exhaustive recitation of the factors which must be considered in the design of a random access memory chip, where the physical size of the memory chip is in the order of 0.200 inch by 0.200 inch.

For example, electrical connections must be made to the memory chip. These connections require metal pads of conductive material. Various techniques have been utilized by the art to make electrical connection to the memory chip. All of the connection techniques utilize chip area.

At least one significant consideration for increasing circuit density is that yield is increased with circuit density, providing other considerations such as heat dissipation, can be successfully accommodated.

Applicant has found that by employing an improved Sense Amplifier bias circuit, the operation of a random access memory, fabricated on a monolithic chip and employing a bistable device for each binary bit stored, is materially improved. Namely, the energy requirements of the individual cells and the memory are reduced. The sensitivity of the Sense Amplifier is increased. In particular, by employing a Sense Amplifier bias circuit in accordance with the teaching of applicants' invention, the read mode operation of a random access memory contained on a monolithic chip is materially improved.

In high circuit density memory arrays, the chip area utilized by a memory cell should be as samll as is consistent with reliable operation. The energy required by the memory and each memory cell thereof should be as small as is consistent with reliable operation. The signal swing of each cell should be as small as is consistent with reliable operation.

Small signal swings increase memory speed, reduce energy requirements, and heat dissipation requirements. However, small signal swings require greater sensitivity of detection apparatus to be accurately and unfailingly detected. Small signal swings in semiconductor devices and structures, such as a random access memory on a monolithic chip, are manifested by currents in the microampere range or voltages in the millivolt range. As is well known in the art, current and voltages of this magnitude as employed in high circuit density monolithic devices, are very sensitive to noise, temperature and process or quality control limits in the fabrication of the device.

Thus applicant has discovered that a Sense Amplifier Bias circuit fabricated on the memory chip and which electrically simulates and tracks the variation in electrical parameters of the memory cells thereon, permits accurate and reliable sensing of small electrical magnitudes by the Sense Amplifiers.

PREFERRED EMBODIMENT

Figure 2:
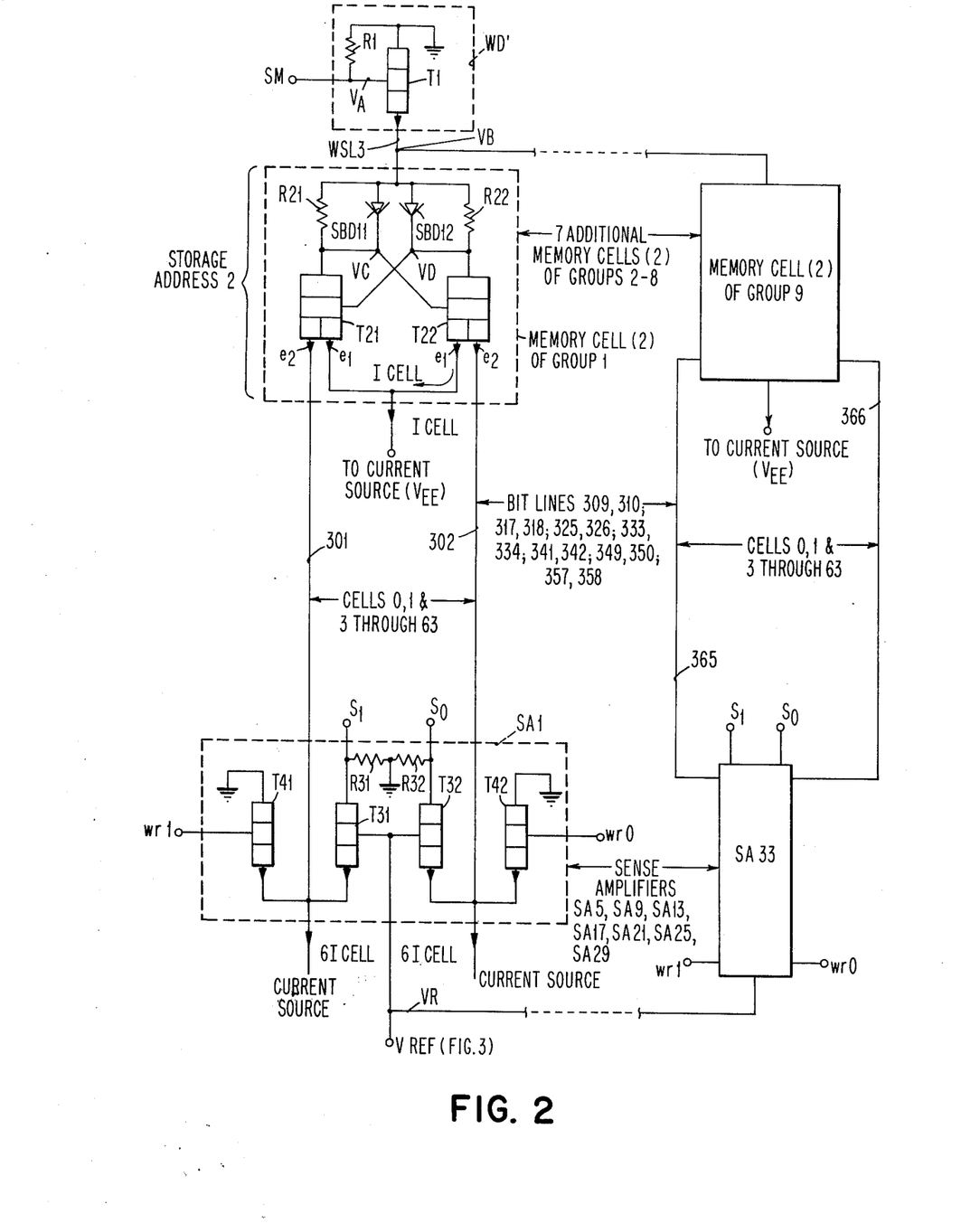
FIG. 2 discloses the memory cell and sense amplifier circuits.
Figure 3:
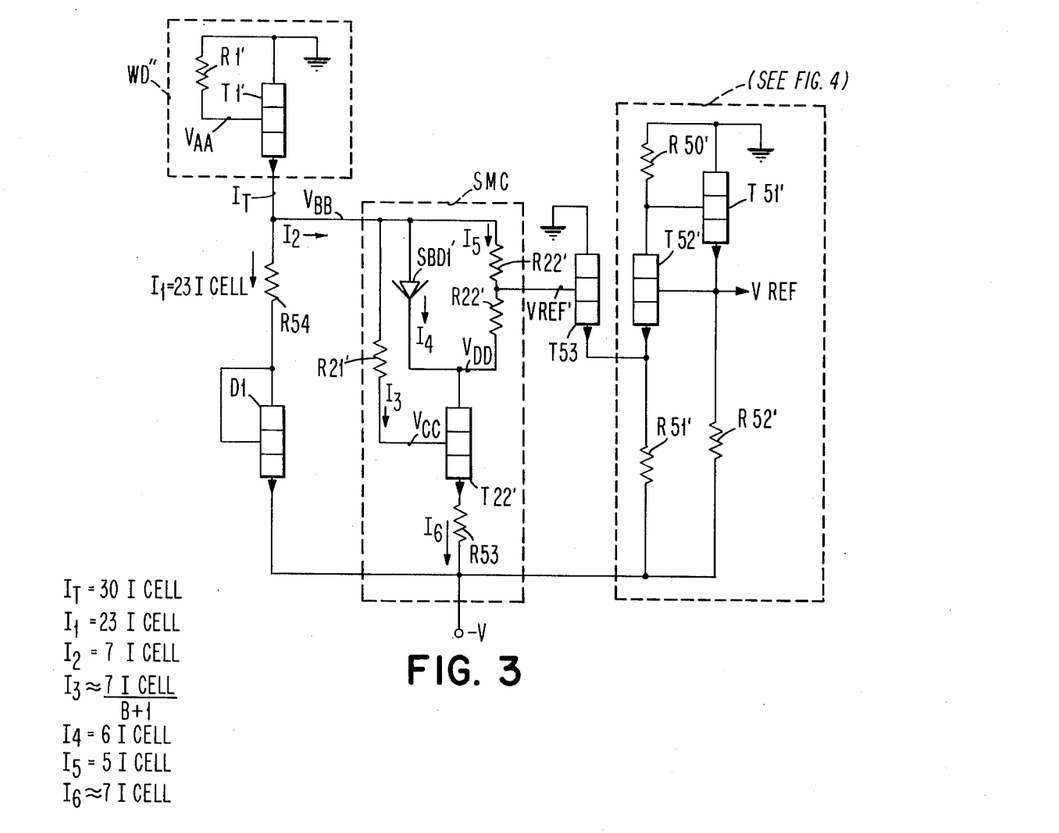
FIG. 3 discloses in detail a sense amplifier bias circuit for practicing of the invention.

Reference is made to FIGS. 1, 2 and 3 of the drawing. A read/write array as generally depicted in FIG. 1 may be employed to practice applicants' invention. As will be appreciated from the detailed description to follow numerous modifications to the memory of FIG. 1 may be made without departing from the spirit and teaching of applicants' invention. For example, the capacity of the memory may be more or less than 256 words, the word size may be more or less than nine binary bits, and the number of memory cells associated with each Sense Amplifier may be more or less than 64. Although applicants' are setting forth their preferred embodiment and best mode now known to them for practicing their invention, numerous variations, modification and alternative embodiments will be apparent to persons skilled in the art.

FIG. 2 depicts in condensed form the storage cells, bit lines and Sense Amplifiers utilized for writing and reading information into storage address 2 of the memory of FIG. 1. It will be recalled that storage address 2 comprises memory cells 2 of each of the groups 1 through 9 as depicted in FIG. 1. Storage address 2 as depicted in FIG. 2 comprises: memory cell (2) of each of the nine groups of FIG. 1; bit line pairs 301 and 302, 309 and 310, 317 and 318 - - - 357 and 358, and 365 and 366; and the afore-recited bit line pairs respectively connecting memory cells (2) of storage address 2 to Sense Amplifiers S.A.1, S.A.5, S.A.9 - - - S.A.25, S.A.29 and S.A.33. Word Select Line WSL3 is shown connected to each of the memory cells 2. WD' represents a portion of the Word Decoder WD of FIG. 1. It is to be appreciated that for purposes of simplicity of illustration and brevity of explanation, certain of the afore-recited structure is not expressly shown in FIG. 2.

In FIG. 2, the circuit of a memory cell that may be employed in the memory of FIG. 1, is shown in detail. Referring to the enclosed broken line labelled "Memory cell (2) of Group 1" the circuit, a bistable storage cell is of the type disclosed and claimed in the afore-identified Harper U.S. Pat. No. 3,423,737. The memory cell comprises a first double emitter transistor $T_{21}$ and a second double emitter transistor $T_{22}$. The emitter $e_2$ of transistor $T_{21}$ is connected to sense line 301. The emitter $e_2$ of transistor $T_{22}$ is connected to sense line 302. The second emitters $e_1$ of each of the transistors $T_{21}$ and $T_{22}$ are connected in common and through bias line $W_3$ (FIG. 1) to a current source (Vee). The base of transistor $T_{21}$ is directly connected to the collector of transistor $T_{22}$. The base of transistor $T_{22}$ is directly connected to the collector of transistor $T_{21}$. Resistors $R_{21}$ and $R_{22}$, preferably equal in magnitude, respectively, connect the collectors of transistors $T_{21}$ and $T_{22}$ to word select line WSL3. Schottky Barrier diode $SBD_{11}$ is connected across resistor $R_{21}$. Schottky Barrier diode $SBD_{12}$ is connected across resistor $R_{22}$.

In the absence of storage address 2 being addressed for reading data therefrom, or for writing data therein, each of the storage cells will be consuming a minimum amount of energy. Each of the cells will be either in a first state of conductivity or a second state of conductivity. Each of the cells will be consuming approximately the same amount of energy. The currents flowing in a cell which is in said first state will be approximately equal in magnitude to the corresponding currents flowing in a cell which is in said second state. Due to the symmetry of the memory cell circuit, it will be seen that the currents flowing in a cell which is in said first state will be symmetrically disposed with respect to the currents flowing in a cell which is in said second state. The above statements presuppose that the electrical parameters of the left hand portion of the memory cell as viewed in FIG. 2 and the electrical parameters of the right hand portion of the memory cell as viewed in FIG. 2 at least approach equality. For purposes of explanation, we will consider each cell of the memory to be identical to every other cell of the memory and for the cells to be symmetrical as to electrical parameters. This condition is substantially true for memories fabricated by Large Scale Integration techniques.

Assume memory cell 2 of Group 1 is in its first conductive state. Transistor $T_{22}$ will be conductive. Transistor $T_{21}$ will be non-conductive. A very small current will flow through resistor $R_{21}$ to the base of transistor $T_{22}$. A small current will flow through resistor $R_{22}$ to the collector of transistor $T_{22}$. A small current will flow through Schottky Barrier Diode $SBD_{12}$ to the collector of transistor $T_{22}$. The sum of these currents flows from emitter $e_1$ of transistor $T_{22}$ to a current source (Vee). The voltage Vc at the collector of transistor $T_{21}$ will be more positive than the voltage $V_d$ at the collector of transistor $T_{22}$. No current (not appreciable, if any) will be flowing in bit lines 301 and 302.

Assume memory cell 2 of Group 1 is in its second conductive state. Transistor $T_{22}$ thereof will be non-conductive. Transistor $T_{21}$ will be conductive. A very small current will flow through resistor $R_{22}$ to the base of transistor $T_{21}$. A small current will flow through resistor $R_{21}$ to the collector of transistor $T_{21}$. A small current will flow through Schottky Barrier Diode $SBD_{11}$ to the collector of transistor $T_{21}$. The sum of these currents flows from emitter $e_1$ of transistor $T_{21}$ to the current source (Vee). The voltage Vc at the collector of transistor $T_{21}$ will be less positive than the voltage Vd at the collector of transistor $T_{22}$. No current (not appreciable, if any) will be flowing in bit lines 309 and 310.

From the above description, it will be apparent that when storage address 2 is not being addressed (word select line WSL3 not selected) for reading or writing each of the memory cells (2) thereof may be in either said first conductive state or said second conductive state. Further each of said cells in said first conductive state has its transistor $T_{22}$ conductive, whereas each of said cells in said second conductive state has its transistor $T_{21}$ conductive. Also no appreciable current if any, will be flowing in any of the bit lines associated with the cells of address (2).

FIG. 2 depicts the nine Sense Amplifiers respectively connected to bit line pairs 301 and 302, 309 and 310, - - - 357 and 358, and 365 and 366. The nine Sense Amplifiers SA1, SA5 - - - SA29 and SA33 and associated bit lines are utilized when writing information into, or reading information from any of the storage addresses 0 through 63, respectively.

Referring to FIG. 2, a suitable circuit for the Sense Amplifiers is shown. Enclosed within the broken line labelled "SA1" are four transistors $T_{31}$, $T_{32}$, $T_{41}$ and $T_{42}$. Transistor $T_{41}$ has its collector connected to a reference potential (ground), its base connected to a terminal Wr1, and its emitter connected to bit line 301. Transistor $T_{42}$ has its collector connected to said reference potential (ground), its base connected to a terminal Wr0, and its emitter connected to bit line 302. Transistor $T_{31}$ has its collector connected through a resistor $R_{31}$ to said reference potential (ground), and its emitter connected to bit line 301. Transistor $T_{32}$ has its collector connected through resistor $R_{32}$ to said reference potential (ground), and its emitter connected to bit line 302. Resistors $R_{31}$ and $R_{32}$ are equal in magnitude. Terminals $S_1$ and $S_0$ are respectively directly connected to the collectors of transistors $T_{31}$ and $T_{32}$. The bases of transistors $T_{31}$ and $T_{32}$ are connected in common to lead VR. The emitters of transistors $T_{41}$ and $T_{31}$ and bit line 301 are connected in common to a current source. The emitters of transistors $T_{32}$ and $T_{42}$ and bit line 302 are connected in common to a current source.

It will be apparent to persons skilled in the art that by placing suitable potentials on Word Select Line (WSL3), the bases of transistors $T_{31}$ and $T_{32}$, terminal WrO, and terminal Wr1, the electrical state of the bistable device (memory cell) associated therewith, may be dictated, or set. This is the technique employed to write information into the memory.

Reference is made to the enclosed broken line WD' in FIG. 2. Transistor $T_1$ has its collector connected to said reference potential (ground), its base connected to a terminal SM, and its emitter connected to Word Select Line WSL3. It will be apparent that transistor $T_1$ can be made to conduct more current by making the potential at terminal SM less negative. When the memory cells connected to word select line WSL3 are not being addressed for writing or reading, the potential at terminal SM is at its more negative value, the emitter current of transistor $T_1$ is at its lesser magnitude, the potential of Word Select Line WSL3 is at its more negative value and the potential across the memory cells associated with Word Select Line WSL3 is at its lesser value. When the memory cells connected to Word Select Line WSL3 are being addressed for writing, or reading, the potential at terminal SM is at its least negative value, the emitter current of transistor $T_1$ is at its greater magnitude, the potential of Word Select Line WSL3 is at its least negative value and the potential across the memory cells associated with Word Select Line WSL3 is at its greater value.

As stated earlier herein, the Word Decoder means represented by the block WD in FIG. 1 may be any one of a number of circuits known to, or readily provided by those skilled in the art. The circuitry represented by WD' in FIG. 2 discloses a portion of a suitable Word Decoder having an emitter follower output.

When Word Select Line WSL3 is not selected, terminal SM will have a first negative potential impressed thereon. When Word Select Line WSL3 is selected, terminal SM will have a second negative potential impressed thereon. Said second negative potential being more positive than said first negative potential. When Word Select Line WSL3 is selected by a more positive potential on terminal SM of WD' (FIG. 2) the emitter current of transistor $T_1$ is materially increased and the potential on line WSL3 is less negative. Namely, a greater potential is impressed across the memory cells connected to line WSL3. For reading or writing information into any of the memory cell addresses connected to a word line, the word line must be selected.

WRITE MODE

For purposes of illustration, consider the example where it is desired to write the binary word 111111110 into storage address 2. Further, consider that said first conductive state of a memory cell represents the storage of a binary "1" and said second conductive state represents the storage of a binary "0". In short, by definition, for purposes of explanation, when transistor $T_{22}$ is conductive, the memory cell is in said first conductive state and when transistor $T_{21}$ is conductive the memory cell is in said second conductive state.

Referring to FIG. 1, when information is to be written into storage address 2, the potential on terminal SM of WD' is made less negative. This increases the emitter current of transistor $T_1$, reduces the potential drop across $T_1$ and raises the potential on Word Select Line WSL3. Also, the reference voltage, or bias impressed on the bases of transistors $T_{31}$ and $T_{32}$ of the Sense Amplifiers SA1 through SA36 is made more negative.

Under these conditions to write binary "1's" into memory cells 2 of Groups 1 through 8 respectively, the potential applied to terminal Wr1 of the Sense Amplifiers (SA1, SA5, SA9, - - - SA21, SA25 and SA29) is raised to a relatively positive potential as compared to the potential applied to terminal Wr0 of said Sense Amplifiers. Stated alternatively, transistors $T_{41}$ of the afore-recited Sense Amplifiers are turned "on", whereas transistors $T_{42}$ of said Sense Amplifiers are maintained in their "off" condition.

Now referring to FIG. 2, it is to be appreciated that transistors $T_{41}$, $T_{21}$ and $T_{31}$ may be considered to comprise a first current switch and transistors $T_{42}$, $T_{22}$ and $T_{32}$ may be considered to comprise a second current switch. Transistors $T_{31}$ and $T_{32}$ are in a non-conductive state due to the relatively high negative potential applied to their bases during the "write mode". With transistor $T_{41}$ biased "on", transistor $T_{21}$ is biased "off". With transistor $T_{42}$ biased "off" transistor $T_{22}$ is biased "on". Namely, of the first current switch transistor $T_{41}$ is the only transistor providing emitter current to the current source connected to the emitters of transistors $T_{41}$, $T_{21}$ and $T_{31}$. Of the second current switch transistor $T_{22}$ is the only transistor providing emitter current to the current source connected to the emitters of transistors $T_{32}$, $T_{22}$ and $T_{42}$. Thus transistor $T_{22}$ is rendered conductive and said cell is in said first conductive state storing an electrical manifestation of a binary "1".

In the afore-recited manner, a binary "1" is stored in each of the memory cells 2 of Groups 1 through 8. To write a binary "0" into memory cell 2 of Group 9, the potential applied to terminal W$r$0 of the Sense Amplifier SA33 is raised as compared to the potential applied to terminal W$r$1 of said Sense Amplifier. Stated alternatively, transistor $T_{42}$ of Sense Amplifier SA33 is turned "on", whereas transistor $T_{41}$ of said Sense Amplifier is maintained in its non-conductive state. Thus, as to the first current switch of Sense Amplifier SA33, and memory cell 2 associated therewith, transistor $T_{21}$ will be "on", and transistors $T_{41}$ and $T_{31}$ will be "off". As to the second current switch of Sense Amplifier SA33 and memory cell 2 associated therewith, transistors $T_{32}$ and $T_{22}$ will be "off" and $T_{42}$ will be "on". With transistor $T_{21}$ of memory cell 2 of Group 9 "on", said cell is in its second state of conductivity and electrically manifests a binary "0".

Thus, the binary word 111111110 is written into storage at address 2 of the memory of FIG. 1.

READ MODE

Assume for purposes of explanation, that the storage cells (2) of storage address 2 are respectively in the following states: cells 2 of Groups 1 through 8 are respectively in said first conductive state; and cell 2 of Group 9 is in said second conductive state. Namely, the binary word 111111111 is stored in address 2 of the memory. Thus, with the exception of cell 2 of Group 9, each of the cells of storage address 2 will have its transistor $T_{22}$ conductive, whereas transistor $T_{21}$ of the cell 2 of Group 9 will be conductive.

The information stored in storage address 2 is read (the electrical states of the cells electrically sensed) in the following manner. Word Select Line WSL3 is selected by the word decoder, as explained earlier herein. The electrical potential on Word Select Line 3 (WSL3) is made more positive whereby the potential across each of the storage cells connected to said Word Select Line is increased. A "read mode" bias voltage, termed a reference voltage, is applied by lead VR to each of the Sense Amplifiers SA1 through SA36. The bias, or reference voltage, applied to the Sense Amplifiers during "read mode" is more positive than the bias applied to said Sense Amplifiers during a "write mode". A relatively negative potential is applied to each of the terminals W$r$0 and W$r$1 of each of the Sense Amplifiers. Namely, transistors $T_{41}$ and $T_{42}$ of each of the Sense Amplifiers is biased to an "off" condition during a "read mode".

Referring to cell 2 (one cell of address 2) of memory Group 1, as depicted in FIG. 2, it will be recalled that said cell is in its first conductive state. Namely, transistor $T_{22}$ is conductive manifesting the electrical storage of a binary "1". Under this condition, with a relatively positive bias impressed on the bases of transistors $T_{31}$ and $T_{32}$, transistor $T_{31}$ of the current switch comprised of transistors $T_{41}$, $T_{21}$ and $T_{31}$ is "on". Transistor $T_{22}$ of the current switch comprised of transistors $T_{32}$, $T_{22}$ and $T_{42}$ is "on".

Thus, with the memory in the "Read Mode" and the contents of address 2 being read, the following conditions exist as to cell 2 of Group one and Sense Amplifier SA1 associated therewith. Where $I_{cell}$ is utilized to designate a current having a magnitude in the order of 120 microamperes flowing from emitter $e_1$ of transistor $T_{22}$, a current having a magnitude in the order of 6 $I_{cell}$ (in the order of 6 × 120 microamperes) is flowing from emitter $e_2$ of transistor $T_{22}$. In the Sense Amplifier transistor $T_{31}$ is conductive. A current in the order of 6 $I_{cell}$ flows through resistor $R_{31}$, and transistor $T_{31}$ to the current source. Transistor $T_{32}$ is non-conductive and hence no current flows through resistor $R_{32}$. The voltage drop across resistor $R_{31}$ results in terminal $S_1$ being at a negative potential with respect to ground potential whereas with no current flowing through $R_{32}$, terminal $S_0$ is at ground potential. The potential across terminals $S_1$ and $S_0$ electrically manifests the conductive state of the memory cell and in the instant example, the storage of binary "1" therein.

In the manner described above, the binary "1's" stored in memory cell 2 of each of the Groups 2, 3, 4, 5, 6, 7 and 8 are respectively electrically manifested at the terminals $S_1$ and $S_0$ of the Sense Amplifiers SA5, SA9, SA13, SA17, SA21, SA25 and SA29.

The binary "0" stored in memory cell 2 of Group 9 is electrically manifested at terminals $S_1$ and $S_0$ of Sense Amplifier SA33. Namely, in the memory cell 2 of Group 9, transistor $T_{21}$ is conductive. A current in the order of 6 $I_{cell}$ is flowing from emitter $e_2$ of $T_{21}$ via bit line 365 to the current source. A current in the order of $I_{cell}$ is flowing from emitter $e_1$ of transistor $T_{21}$ to the current source. A current in the order of 6 $I_{cell}$ flows through resistor $R_{32}$ and transistor $T_{32}$ to the current source. The voltage drop across resistor $R_{32}$ results in terminal $S_0$ being at a negative potential with respect to ground potential, whereas with no current flowing through $R_{31}$, terminal $S_1$ is at ground potential.

The reading of information stored in storage address 2, with the memory of FIG. 1 in the "read mode" is summarized in Table 5 below.

TABLE NO. 5 - FIGURE 3

|  | MEMORY IN READ MODE DATA STORED IN ADDRESS 2 | | | | | | | | |
|---|---|---|---|---|---|---|---|---|---|
|  | Cell 2 Group 1 | Cell 2 Group 2 | Cell 2 Group 3 | Cell 2 Group 4 | Cell 2 Group 5 | Cell 2 Group 6 | Cell 2 Group 7 | Cell 2 Group 8 | Cell 2 Group 9 |
| Conductive State of Cell | 1st | 1st | 1st | 1st | 1st | 1st | 1st | 1st | 2nd |
| Data (Binary bit) stored in cell | 1 | 1 | 1 | 1 | 1 | 1 | 1 | 1 | 0 |
| Cell Transistor conductive | $T_{22}$ | $T_{22}$ | $T_{22}$ | $T_{22}$ | $T_{22}$ | $T_{22}$ | $T_{22}$ | $T_{22}$ | $T_{21}$ |
| current emitter $e_1$ | I cell | I cell | I cell | I cell | I cell | I cell | I cell | I cell | I cell |
| current emitter $e_2$ | 6 I cell | 6 I cell | 6 I cell | 6 I cell | 6 I cell | 6 I cell | 6 I cell | 6 I cell | 6 I cell |

TABLE NO. 5 - FIGURE 3-continued

|  | MEMORY IN READ MODE | | | DATA STORED IN ADDRESS 2 | | | | | |
| --- | --- | --- | --- | --- | --- | --- | --- | --- | --- |
|  | Cell 2 Group 1 | Cell 2 Group 2 | Cell 2 Group 3 | Cell 2 Group 4 | Cell 2 Group 5 | Cell 2 Group 6 | Cell 2 Group 7 | Cell 2 Group 8 | Cell 2 Group 9 |
| Total cell current | 7 I cell | 7 I cell | 7 I cell | 7 I cell | 7 I cell | 7 I cell | 7 I cell | 7 I cell | 7 I cell |
| Bit line carrying current | 302 | 310 | 318 | 326 | 334 | 342 | 350 | 358 | 365 |
| Sense Amplifier Transistor Conductive | $T_{31}$ | $T_{31}$ | $T_{31}$ | $T_{31}$ | $T_{31}$ | $T_{31}$ | $T_{31}$ | $T_{31}$ | $T_{32}$ |
| Resistor of Sense Amplifier Carrying Current | $R_{31}$ | $R_{31}$ | $R_{31}$ | $R_{31}$ | $R_{31}$ | $R_{31}$ | $R_{31}$ | $R_{31}$ | $R_{32}$ |
| Terminal $S_1$ | Down | Down | Down | Down | Down | Down | Down | Down | Up |
| Terminal $S_0$ | Up | Up | Up | Up | Up | Up | Up | Up | Down |
| Potential (M.V.) at Node Vc of cell | −1.13 | −1.13 | −1.13 | −1.13 | −1.13 | −1.13 | −1.13 | −1.13 | −1.73 |
| Potential (M.V.) at Node VD of cell | −1.73 | −1.73 | −1.73 | −1.73 | −1.73 | −1.73 | −1.73 | −1.73 | −1.13 |

Potential at node $V_A$ is −.19v
Potential of Word Line WSL3 is −1.065v
$I_{cell}$ is in the order of 120 microamperes
6 $I_{cell}$ is in the order of 720 microamperes
7 $I_{cell}$ is in the order of 840 microamperes
Potential impressed on bases of transistors $T_{31}$ and $T_{32}$ is $$V_{ref} = \frac{V_C + VD}{2} = \frac{-(1.13 + 1.73)}{2} = -1.43 \text{ volts}$$

where: $R_1 = 1000$ ohms
$R_{21} = R_{22} = 5000$ ohms
$R_{31} = R_{32} = 600$ ohms Referring to Table No. 5, whether a memory cell is in said first conductive state (storing a binary "1") or said second conductive state (storing a binary "0") the cell current is in the order of seven $I_{cell}$, where $I_{cell}$ is a current magnitude of approximately 120 microamperes.

From the preceding explanation, Table No. 5, and FIG. 2, it will be apparent that to most efficiently electrically read the content of a storage cell in said first conductive state only transistor $T_{31}$ of the Sense Amplifier should be conducting current. Whereas to most efficiently electrically read the content of a storage cell in said second conductive state only transistor $T_{32}$ should be conducting current. Further, it will be appreciated with "write" transistors "$T_{41}$" and "$T_{42}$" biased "off" during the read mode, the reference voltage Vref applied to the bases of $T_{31}$ and $T_{32}$ is critical and controlling.

The voltage swing of a cell, namely VC and VD, varies with chip temperature. Thus, for an invariant reference voltage (Vref) on th bases of transistors $T_{31}$ and $T_{32}$ during the "read mode", the voltage differential existing across terminals $S_1$ to $S_0$ will be other than optimum. Namely, where VC and VD have respectively shifted in a positive direction, and Vref has not shifted in proportion thereto, the potential differential across terminals $S_1$ to $S_0$ will be adversely effected.

Figure 4:
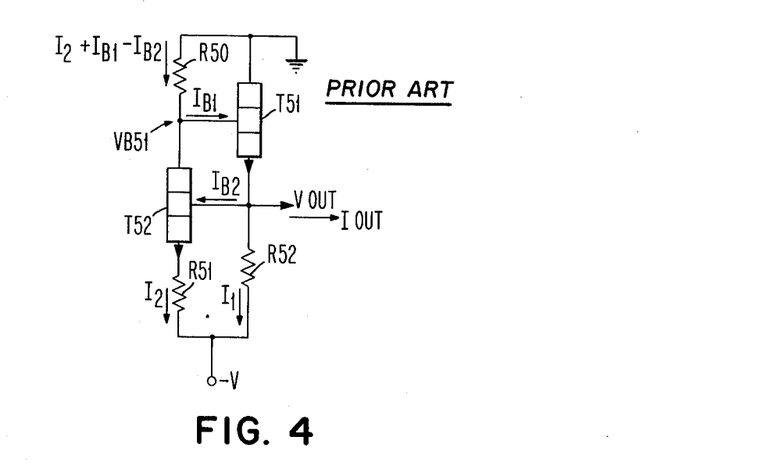
FIG. 4 discloses a sense amplifier bias circuit of the prior art.

Applicant has provided (FIG. 3) a voltage reference source the magnitude of which accurately "tracks" the shift in voltage swing of the memory cell. FIG. 4 discloses a reference voltage source known to the art.

THE PRIOR ART VOLTAGE REFERENCE SOURCE, FIG. 4

In the prior art reference voltage source of FIG. 4, he transistor $T_{51}$ has its collector connected to a reference potential (ground). A resistor $R_{50}$ connects the collector of transistor $T_{52}$ to ground. The collector of transistor $T_{52}$ is connected to the base of transistor $T_{51}$. The base of $T_{52}$ is connected to the emitter of $T_{51}$. A resistor $R_{51}$ connects the emitter of $T_{52}$ to a potential source (−V). A resistor $R_{52}$ connects the emitter of $T_{51}$ to the potential source (−V). The reference potential (Vout) is taken from the emitter of transistor $T_{51}$.

For completeness of disclosure, the typical values for the prior art circuit of FIG. 4 may be as follows:

R50 = 528 ohms
R51 = 2228 ohms
R52 = 515 ohms
−V = −4.25 volts
Vout = −1.43 volts The operation of the circuit of FIG. 4 is as follows: The emitter current of $T_{51}$ is equal to the sum of the base current ($I_{B2}$) of $T_{52}$, the output current ($I_{out}$) used to drive the Sense Amplifier bases $T_{31}$ and $T_{32}$ of the FIG. 2, and the current $I_1$ through resistor $R_{52}$. The current through resistor $R_{50}$ is $I_2 = I_{B1} − I_{B2}$, where $I_{B1}$ and $I_{B2}$ are respectively small in magnitude as compared to $I_2$. The equivalent circuit for approximately the output voltage sensitivity to temperature and power supply consists of a resistor divider of $R_{50}$ and $R_{51}$ connected by the serial combination of the base-emitter drops of $T_{51}$ and $T_{52}$. With increasing temperature, the base-emitter voltages of $T_{51}$ and $T_{52}$ decrease, and node $V_{B51}$ moves negative by an amount proportioned to the $R_{50}$ and $R_{51}$ resistor radio ($R_{50} \div (R_{50} + R_{51})$) multiplied by the temperature coefficients of $T_{51}$ and $T_{52}$. Thus, with the component values as specified, this resistor ratio is 0.192. The rate of decrease with temperature of each of $T_{51}$ and $T_{52}$ base-emitter voltages is approximately 1.8 millivolts per degree centigrade (1.8 mv/° c). Therefore with increasing temperature node $V_{B51}$ moves negative by the amount $0.192 \times 2X (−1.8\text{mv}/°\text{c}) = −0.69\text{mv}/°$ c; the output ($V_{out}$) moves positive by the amount $−0.69$ mv/° c − (−1.8mv/° c) = 1.11mv/° c. Since the memory cell mid-way voltage moves positive at approximately 3.0mv/° c, it is apparent that the circuit of FIG. 4 does not accurately follow the shifting due to temperature of the mid-point of the cell voltage swing. As an example, at 85° C there would be a 113 mv off-centering of the bias voltage.

In a similar manner, it can be shown that the prior art circuit of FIG. 4 is much more sensitive to power supply and component variations than are the cell "up" and "down" levels. Neglecting the slight variations in $T_{51}$ and $T_{52}$ forward bias due to load current changes, $V_{out}$ of FIG. 4 shifts by an amount equal to the aforementioned resistor ratio (0.192) multiplied by the variation in power supply. This ratio is naturally a function of the tracking of resistors $R_{50}$ and $R_{51}$. On the other hand, the cell "up" and "down" levels are relatively insensitive to power supply changes. The cell "up" level is largely a function of the word-line driver transistor beta and base-emitter voltage; while the selected cell "down" level is well clamped and is hence very much a function of the cell Schottky diode whose effect is not simulated in the earlier bias circuit. At a fixed temperature and nominal process and power supply, generation of an equivalent cell mid-way voltage is attainable with the prior art circit. However, it is apparent that due to their different sensitivities to process and power supply fluctuations that the statistical variation between cell levels and bias circuit will be very appreciable. The statistical variation known in the art as standard deviation or sigma can be related to the overall expected yield during fabrication of the device.

When the reference voltage source of FIG. 4 is employed with in a memory generally of the type disclosed in FIGS. 1 and 2, $V_{out}$ must have a magnitude that falls mid-way between the cell Up and Down levels. Since the signal swing of the memory cell is small, in order to prevent saturation (typically 600 millivolts with a minimum of approximately 500 millivolts), $V_{out}$ (FIG. 4) must track very close with the cell circuit components and with temperature. Failure of $V_{out}$ to do so could result in improper reading or indeterminate output states (both $S_1$ and $S_0$ UP or DOWN simultaneously), or loss of the data stored in the cell.

The prior art bias, or reference source depicted in FIG. 4 has a number of shortcomings. These shortcomings are recited below. The voltage differential between cell levels and bias circuit output ($V_{out}$) has a very large sigma of 52 millivolts. The reasons for this are: (a) $V_{out}$ is much more sensitive to $-V$ variations than are the memory cells (b) $V_{out}$ does not track with SBD of memory cell (c) $V_{out}$ is very sensitive to tracking of $R_{50}$ and $R_{51}$, and (d) $V_{out}$ is very sensitive to output loading. $V_{out}$ and memory cell UP and DOWN levels move, or shift, at different rates with temperature. The memory cell mid-way voltage decreases at approximately 3.0mv/° c while $V_{out}$ of the circuit of FIG. 4 decreases at only 1.1mv/° c. This causes a 113 mv off-centering of the bias voltage at 85° c.

IMPROVED BIAS CIRCUIT OF FIG. 3

The improved bias circuit, or reference voltage source is depicted in FIG. 3. The reference characters containing a prime (') in FIG. 3 indicate that the structure denoted thereby has a counterpart in the memory cell (FIG. 2) or in the bias circuit of FIG. 4.

Referring to FIGS. 2 and 3, a substantially one to one correspondence of circuit structure exists as to portions of the circuit set-forth in each of said figures. Namely, a portion of the memory cell circuit structure of FIG. 2 corresponds to a portion of the voltage reference source circuit structure of FIG. 3. The circuitry enclosed within the broken line WD" of FIG. 3 corresponds to the circuitry enclosed within the broken WD' of FIG. 2. The circuitry enclosed within the broken line "See FIG. 4" of FIG. 3 corresponds to the prior art bias circuit depicted in FIG. 4.

Referring to FIG. 3, transistor $T_1'$ has its collector connected to a reference potential (ground). Resistor $R_1'$ is connected between the base and collector of transistor $T_1'$. For purposes of power consumption, the current through transistor $T_1'$ was scaled to be Ω the current of transistor $T_1$ of FIG. 2. Therefore, resistor $R_1'$ is identical to $3 \times R_1$ and transistor $T_1'$ has identical beta and $V_{BE}$ characteristics at ⅓ the current of $T_1$.

The emitter current of transistor $T_1$ can be determined from Table 5. The contribution to $T_1$ current of the 9 selected cells is $n \times 7 I_{cell}$, where $n = 9$; the contribution to $T_1$ current of the additional 27 cells on the common word line but not addressed (bit-line current = 0) is $27 = I_{cell}$. Therefore, by properly designing the emitter current of $T_1$, to be equal to $\frac{1}{3} \times I_1 = \frac{1}{3} \times (9 \times 7 I_{cell} + 27 I_{cell}) = 30 I_{cell}$, the potential VAA at the base of transistor $T_1'$, is substantially equal in magnitude to the potential VA at the base of transistor $T_1$ of FIG. 2; in addition, the potential VBB of FIG. 3 will be substantially equal in magnitude to the potential VB at the emitter of transistor $T_1$ of FIG. 2. Node VB is the potential of a selected word line (WSL3 in the illustrative example) when the memory is in the read mode.

A current of $I_1$ flows through resistor $R_{54}$ and diode $D_1$ to the source $-V$. Diode $D_1$ as depicted in FIG. 3 may comprise a transistor having its base and collector connected in common. The current $I_1$ represents approximately the current as seen by all but one selected cell on the common addressed word line ($V_B$ of FIG. 2). With the scaling factor previously mentioned, $I_1$ is approximately $30 \times I_{cell} - 7 I_{cell} = 23 I_{cell}$.

Current $I_2$ of FIG. 3 is designed to draw approximately $7 I_{cell}$ such that the simulation of selected word line voltage at node $V_{BB}$ is complete. From the afore-recited operation of the memory cells, and Table 5, it will be recalled that transistor $T_{22}$ of each memory cell in the first conductive state has an emitter current of 7 $I_{cell}$ and transistor $T_{21}$ of each memory cell in the second conductive state has an emitter current of 7 $I_{cell}$. Thus, the emitter current of transistor $T_{22'}$ of the circuitry enclosed within the broken line labelled S.M.C. (Simulated Memory Cell) is approximately equal to the current flow within any one of the memory cells being addressed by said memory during "read mode". Referring to the circuitry enclosed by the broken line labelled S.M.C. of FIG. 3, the following currents are flowing. A current of $I_3$ where $I_3$ is approximately equal to (7 $I_{cell}$) (B + 1), is flowing through $R_{21'}$ to the base of transistor $T_{22'}$. This resistor is not expressly required in generating transistor $T_{22'}$ emitter current but is included as contained in the cells only as a precautionary measure should a saturation condition exist due to some unexpected process variation. Thus potential $V_{CC}$ at the base of transistor $T_{22'}$ is equal in magnitude to the potential $V_c$ at the base of the conductive transistor $T_{22}$ of the memory cell of FIG. 2 when said cell is in its first conductive state. A current of $I_4$, where $I_4$ is equal to 6 $I_{cell}$ and is identical to that of the "on" cell Schottky (SBD$_{11}$ or SBD$_{12}$) of FIG. 2 is flowing through Schottky Barrier Diode (SBD$_{1'}$ to the collector of transistor $T_{22'}$. Thus, potential $V_{DD}$ at the collector of transistor $T_{22'}$ is equal in magnitude to the potential $V_D$ at the collector of transistor $T_{22}$ of the memory cell of FIG. 2 when said cell is in its first conductive state. A current $I_5$ flows from node $V_{BB}$ of FIG. 3 into node $V_{ref}$. A portion of this current flows into the collector of transistor $T_{22'}$ and is adjusted at is $I_6$ to generate the required Schottky current $I_4$, hence equivalent cell down level at node $V_{DD}$. The remaining portion of $I_5$ is the base current of transistor $T_{53}$. Thus, the value of $I_5$ is designed to produce a voltage $V_{ref}$ which is a midway voltage between cell "up" and "down" levels, and includes the simulation of the difference between word-line voltage and actual cell "up" level. The emitter current of transistor $T_{53}$ is approximately $I_{cell}$ to produce the required $V_{ref}$.

Thus, the improved bias circuit, as illustrated in FIG. 3, for 256 × 9R/W array simulates the exact loading of the cells as seen by the selected word driver. Referring to FIG. 2 and Table No. 5, in the read mode, one cell output is UP and one is DOWN and the current of one selected cell is 7 $I_{cell}$. The circuit of FIG. 3 generates the exact cell UP and DOWN levels and the mid-way voltage $V_{ref}$ is produced. The output $V_{ref}$ from the midpoint of resistors $R_{22'}$ has a high output impedance unsuitable for driving loads. $V_{ref}$ is translated by means of a differential amplifier comprised of transistors $T_{53}$, $T_{52'}$ and $T_{51'}$ to a low impedance $V_{ref}$ output suitable for driving the total chip (72 bases). Namely, the bases of the two transistors of each of the thirty-six Sense Amplifiers in the illustrative embodiment. Component values are chosen such that the emitter current of transistor $T_{53}$ and $T_{52'}$ are identical, hence $V_{ref} = V_{ref}'$.

It will now be apparent that the currents in the bias circuit of FIG. 3 are equal to the currents seen by the memory cell and word driver, whereby the following relationships exist (compare FIG. 3 and FIG. 2):

$V_{AA}$ (Bias circuit) = $V_A$ (Word Driver or Word Decoder)
$V_{BB}$ (Bias circuit) = $V_B$ (Word Line Selected)
$V_{CC\ (Bias\ circuit)} = V_C$ (Cell UP Level)
$V_{DD}$ (Bias circuit) = $V_D$ (Cell DOWN Level)
$V_{ref} = \frac{1}{2} (V_{CC} = V_{DD}) = \frac{1}{2}(V_C + V_D)^* =$ mid-way voltage
$V_{ref} = V_{ref}'$
*The voltage difference between word line $V_B$ and the cell UP level $V_C$ due to base loading is simulated in the bias circuit by adjusting the current of the differential amplifier of the bias circuit of FIG. 3.

A statistical analysis verified the above relationships within the normal component tracking tolerances.

The bias voltage $V_{ref}$ was shown to move at the same rate with temperature, namely 3.0 mv/° c, as the cell mid-way voltage. Also, the standard deviation or sigma of the voltage differential between cell levels and $V_{ref}$ was reduced from the previous 52 mv with the prior art circuit to only 20 mv - - - resulting in improved yield.

For the circuitry of FIGS. 2 and 3, typical and suitable resistance values and potential values may be as follows:

| Figure 2 | | Figure 3 | |
|---|---|---|---|
| $R_1$ | = | $R_{1'}$ | = 1000 ohms |
| $R_{21}$ | = | $R_{22'}$ | = 5000 ohms |
| $R_{22}$ | = | $R_{22'}$ | = 5000 ohms |
| $R_{31}$ | = | — | = 600 ohms |
| $R_{32}$ | = | — | = 600 ohms |
| | | $R_{54}$ | = 1153 ohms |
| | | $R_{53}$ | = 2760 ohms |
| | | $R_{50'}$ | = 528 ohms |
| | | $R_{51'}$ | = 1114 ohms |
| | | $R_{52'}$ | = 515 ohms |
| $V_A$ | = | $V_{AA}$ | = −0.19 volts |
| $V_B$ | = | $V_{BB}$ | = −1.065 volts |
| $V_C$ | = | $V_{CC}$ | = −1.13 volts |
| $V_D$ | = | $V_{DD}$ | = −1.73 volts |
| $V_{ref} = V_{ref}' = \frac{V_{CC} + V_{DD}}{2} =$ | | $\frac{-1.13 - 1.73}{2} =$ | −1.43 volts |

It is to be expressly understood that foregoing circuit values are illustrative, and are not to be construed as a limitation of applicants' invention and teaching. From the general and specific embodiment and disclosure of applicants' invention recited herein, persons skilled in the art will readily foresee numerous embodiments of applicants' invention which fall within the spirit and scope of applicants' invention.

Thus, the bias circuit of FIG. 3 provides an output potential $V_{ref}$ having a magnitude equal to the mid-point voltage of the voltage swing of a memory cell. As the temperature of the chip containing the memory cells and the bias circuit of FIG. 3 increases the currents in the memory cells and bias circuit respectively, change in magnitude in a related, or direct manner, whereby the magnitude of the reference voltage $V_{ref}$ tracks or follows the mid-point of the voltage swing of the memory cells.

More broadly stated, the currents flowing in the bias circuit of FIG. 3 simulate the currents flowing in the memory cells whereby as potentials in the memory change with temperature, potentials in the bias circuit change with temperature in a related manner thereto. The changes in potential of cell potentials due to temperature and the output potential of the bias circuit shifts in synchronism with the mid-point of the voltage swing of the memory cell.

Applicants have described in detail a preferred embodiment of their invention in addition to the detailed description of a general embodiment of their invention. From the disclosure and teaching of applicants' invention contained herein, numerous modifications to applicants' invention will be apparent to those skilled in the art, without departing from the practice of applicants' invention.

While the invention has been particularly described with reference to the preferred embodiment thereof, it will be understood by those skilled in the art that numerous changes in form and detail may be made without departing from the sprit and scope of the invention.

What is claimed is:

1. A reference voltage source for use in a random access monolithic memory having a plurality of data storage cells, each of said cells comprising a first transistor and a second transistor,
   each of said cells being adapted to assume either a first stable state of conductivity or a second stable state of conductivity,
   sense amplifier means coupled to said plurality of data storage cells,
   selection means coupled to said plurality of cells for causing predetermined ones of said plurality of cells to electrically manifest to said sense amplifier means whether said predetermined ones of said plurality of cells are respectively in said first stable state of conductivity or said second stable state of conductivity,
   said sense amplifier means being responsive to said electrical manifestations of said predetermined ones of said plurality of cells and said reference voltage source for providing a first electrical output for each of said predetermined ones of said plurality of cells which is in said first stable state and a second electrical output for each of said predetermined ones of said plurality of cells which is in said second stable state,
   said reference voltage source comprising:
   a third transistor having a collector, base and emitter;
   said collector of said third transistor being directly connected to a first potential;
   a first resistor connecting said base of said third transistor to said first potential;

a fourth transistor having a collector, base and emitter;

a second resistor connecting said collector of said fourth transistor to said emitter of said third transistor;

means directly connecting said base of said fourth transistor to said collector of said fourth transistor;

means directly connecting said emitter of said fourth transistor to a second potential source;

a fifth transistor having a collector, base and emitter;

a third resistor connecting said emitter of said fifth transistor to said second potential source;

a fourth resistor connecting said emitter of said third transistor to said base of said fifth transistor;

a Schottky Barrier diode connected between said emitter of said third transistor and said collector of said fifth transistor;

fifth and sixth resistors serially connected between said emitter of said third transistor and said collector of said fifth transistor;

a sixth transistor having a collector, base and emitter;

means directly connecting said collector of said sixth transistor to said first potential;

means directly connecting said base of said sixth transistor to the juncture of said fifth and sixth resistors;

a seventh resistor connecting said emitter of said sixth transistor to said second potential;

a seventh transistor having a collector, base and emitter;

means directly connecting said emitter of said seventh transistor to said emitter of said sixth transistor;

an eighth resistor connecting said collector of said seventh transistor to said first potential;

an eighth transistor having a collector, base and emitter, said collector of said eighth transistor being connected to said first potential source;

means directly connecting said base of said eighth transistor to said collector of said seventh transistor;

a ninth resistor connecting said emitter of said eighth transistor to said second potential;

a reference voltage source output terminal directly connected to said base of said seventh transistor and said emitter of said eighth transistor;

and means connecting said reference voltage source output terminal to said sense amplifier means, whereby the potential of said reference voltage source manifested at said reference voltage source output terminal tracks the magnitude of the electrical manifestations from said predetermined ones of said plurality of cells.

2. In a bi-polar random access monolithic memory having a plurality of memory cells for respectively storing electrical manifestations of a logical "1", of a logical "0", and wherein each cell provides a first electrical manifestation having a magnitude of $V_1$ millivolts when a logical "1" is stored therein, a second electrical manifestation having a magnitude of $V_0$ millivolts when a logical "0" is stored therein, a voltage reference source for use in determining whether a logical "1" or a logical "0" is stored in selected ones of said plurality of memory cells, said voltage reference source comprising:

bi-polar transistor circuit means including a simulated memory cell;

and bi-polar amplifier means responsive to said bi-polar transistor circuit means for providing a reference voltage bearing a substantially invariant mathematical relationship to the potentials $V_1$ and $V_0$ of said first and second electrical manifestations.

* * * * *